(12) United States Patent
Jian et al.

(10) Patent No.: US 6,534,896 B2
(45) Date of Patent: Mar. 18, 2003

(54) SPATIAL HARMONIC TRANSDUCERS FOR SURFACE WAVE DEVICES

(75) Inventors: Chun-Yun Jian, Ottawa (CA); Steve A. Beaudin, Ottawa (CA); Conrad F. Gratton, Casselman (CA)

(73) Assignee: Nortel Networks Limited, St. Laurent (CA)

(*) Notice: Subject to any disclaimer, the term of this patent is extended or adjusted under 35 U.S.C. 154(b) by 0 days.

(21) Appl. No.: 09/854,595

(22) Filed: May 15, 2001

(65) Prior Publication Data

US 2002/0171329 A1 Nov. 21, 2002

(51) Int. Cl.[7] .......................... H01L 41/04; H01L 41/08; H01L 41/18; H02N 2/00
(52) U.S. Cl. .................... 310/313 B; 310/313 R; 310/313 A
(58) Field of Search .................. 310/313 R, 313 A, 310/313 B, 313 C, 313 D, 311; 333/195, 194, 193, 196

(56) References Cited

U.S. PATENT DOCUMENTS

| 4,642,506 | A | * | 2/1987 | Lewis | 310/313 B |
|---|---|---|---|---|---|
| 4,910,839 | A | * | 3/1990 | Wright | 29/25.35 |
| 4,965,479 | A | * | 10/1990 | Elliot et al. | 310/313 D |
| 5,363,073 | A | * | 11/1994 | Higgins, Jr. | 310/313 B |
| 5,663,695 | A | * | 9/1997 | Tanaka et al. | 333/193 |
| 5,682,126 | A | * | 10/1997 | Plesski et al. | 333/193 |
| 5,909,157 | A | * | 6/1999 | Tanaka et al. | 333/193 |
| 5,952,765 | A | * | 9/1999 | Garber et al. | 310/313 B |
| 6,034,577 | A | * | 3/2000 | Matsui et al. | 310/313 B |
| 6,121,860 | A | * | 9/2000 | Tsutsumi et al. | 310/313 D |
| 6,127,769 | A | * | 10/2000 | Kadota et al. | 310/313 B |
| 6,127,904 | A | * | 10/2000 | Tanaka et al. | 333/193 |
| 6,137,380 | A | * | 10/2000 | Ushiroku et al. | 310/313 D |
| 6,140,890 | A | * | 10/2000 | Sakairi | 310/313 D |
| 6,172,580 | B1 | * | 1/2001 | Taniguchi et al. | 333/193 |
| 6,351,196 | B1 | * | 2/2002 | Nakamura et al. | 310/313 B |

FOREIGN PATENT DOCUMENTS

| EP | 0483940 | 1/1991 | H03H/9/145 |
|---|---|---|---|
| EP | 0483940 A 1 | 1/1991 | H03H/9/145 |
| EP | 0802627 | 11/1996 | H03H/9/145 |
| EP | 0802627 A 1 | 11/1996 | H03H/9/145 |

OTHER PUBLICATIONS

J.M. Hode, J. Desbois, P. Dufilie, M. Solal, P. Ventura; "SPUDT–Based Filters: Design Principles and Optimization"; Thomson Microsonics; 1995 IEEE; pp. 39–50.

Helge Engan, "Surface Acoustic Wave Multielectrode Transducers", IEEE Transactions on Sonics and Ultrasonics, vol. SU–22, No. 6, ovember 1975, pp. 395–401.

B. Fleischmann & H. Skeie, "Higher Harmonic Surface Transverse WaveFilters" 1989 Ultrasonics Symposium, pp. 235–239.

R. Dill, K. Anemogiannis, H.–P. Grassl, "GHZ Low–Loss Filters on LITAO$_3$ Operating at Higher Harmonics", 1989 Ultrasonics Symposium, pp. 251–254.

(List continued on next page.)

Primary Examiner—Nestor Ramirez
Assistant Examiner—Julio C. Gonzalez

(57) ABSTRACT

A spatial harmonic transducer of a SAW device is made directional for SAWs at a spatial harmonic signal frequency of the transducer by a reflector for reflecting SAWs at that frequency. The transducer comprises repeated groups of consecutive electrodes having a predetermined polarity sequence, positioned to operate coherently for SAWs at the signal frequency. The reflector comprises reflector electrodes for producing constructive and destructive interference in opposite SAW directions, with electrode widths and spacings of at least a quarter wavelength at the signal frequency. A SAW device with two such spatial harmonic SPUDTs using different polarity sequences can provide desirable characteristics for filters and delay lines at frequencies of about 2 GHz.

20 Claims, 5 Drawing Sheets

OTHER PUBLICATIONS

R. Huegli, "Harmonic GHz Surface–Acoustic–Wave Filters with Unidirectional Transducers", IEEE Transactions on Ultrasonics, Ferroelectrics, and Frequency Control, vol. 40, No. 3, May 1993; pp. 177–182.

C.M. Cabreira, C.A. Finardi, AM de Almeida;; M. Barnet; "A 622.08 MHz narrow bandwidth SAW filter for clock recovery", SBMO/IEEE MTT–S IMOS '95 Proceedings, pp. 283–286.

David. P. Morgan, "Surface–Wave Devices for Signal Processing"; Studies in Electrical and Electronic Engineering 19; Elsevier; pp. 89–95.

J. Yin, D. Zhang, P. Wu, J. Yu and Y. Li; "Novel Architecture of Harmonic Filter", 1995 IEEE Ultrasonics Symposium; pp. 23–26.

C.C.W. Ruppel; L. Reindl; S. Berek; U. Knauer; P. Heide & M. Vossiek; "Design, Fabrication, and Application of Precise Delay Lines at 2.45 GHz"; 1996 IEEE Ultrasonics Symposium; pp. 261–265.

J.M. Hodé,"SPUDT–Based Filters: Design Principles and Optimization", 1995 IEEE Ultrasonics Symposium, pp. 39–50.

* cited by examiner

SPATIAL HARMONIC TRANSDUCERS FOR SURFACE WAVE DEVICES

This invention relates to surface wave devices, and is particularly concerned with spatial harmonic transducers for surface wave devices. The term "surface wave" is used herein to embrace surface acoustic waves (SAWs), including leaky SAWs, surface skimming bulk waves, and similar acoustic waves, and is abbreviated to SAW below. A spatial harmonic transducer is an interdigital transducer (IDT) in which a number of electrodes have a predetermined polarity sequence which is repeated over a plurality of periods along the length of the transducer.

BACKGROUND OF THE INVENTION

As is well known, SAW devices provide significant advantages, such as low cost, small size, and desirable filter characteristics, in various filtering and delay applications, especially in wireless communications systems. However, the limitations of photolithographic techniques which are used for manufacturing SAW devices have made it difficult to provide SAW devices with the desired characteristics for operation at very high frequencies, for example exceeding 1 GHz and especially at frequencies of about 2 GHz for current wireless communications systems.

For example, it would be desirable to be able to provide low loss FIR (finite impulse response) SAW device filters for operation as channel select filters at a first IF (intermediate frequency) of about 2 GHz in a 28 GHz wireless communications systems. A SAW device using spatial harmonic transducers can be provided to operate at 2 GHz with excellent selectivity, but such transducers are bidirectional and provide high loss (e.g. >20 dB). SAW resonator structures can provide IIR (infinite impulse response) filters for operation at this frequency with very low loss (e.g. <5 dB), but have other characteristics such as shape factor, bandwidth, passband amplitude ripple, and group delay which make them ill suited for channel select filters. SPUDT (single phase unidirectional transducer) SAW devices can provide excellent characteristics at lower frequencies, but require a higher resolution to produce their narrower electrodes, and manufacture of SPUDT SAW devices for operation at frequencies of about 2 GHz has not yet been practical.

In a wireless communications system operating at a radio frequency (RF) of about 2 GHz, it is known to provide feed forward error correction, for which a delay of about 130 ns is required. This delay is typically provided by a coaxial cable with a length of about 40 meters. It would be very desirable, especially in terms of cost and size, to replace this cable with a SAW delay device operating at this RF and providing a wide fractional bandwidth, low insertion loss, and linear phase throughout its pass band.

Accordingly, a need exists to provide improved SAW devices for operation at particularly high frequencies.

SUMMARY OF THE INVENTION

According to one aspect, this invention provides a SAW (surface wave) device comprising an inter-digital transducer on a substrate of piezoelectric material, the transducer comprising a plurality of groups of electrodes, the electrodes of each group having a predetermined polarity sequence, the groups being arranged along a length of the transducer to operate coherently for SAWs at a signal frequency of the transducer, the signal frequency having a spatial harmonic relationship to a frequency corresponding to a pitch of said electrodes, wherein the transducer further comprises at least one reflector for reflecting SAWs at the signal frequency, the reflector being positioned relative to said groups of electrodes to provide constructive interference of SAWs at the signal frequency in one direction along the length of the transducer and to provide destructive interference of SAWs at the signal frequency in an opposite direction.

Preferably the reflector comprises reflector electrodes having a pitch determined by a SAW wavelength at the signal frequency, and the electrodes of said groups have a pitch determined by a SAW wavelength at a lower frequency to which the signal frequency is spatially harmonically related. Desirably each electrode has a width of at least about $\lambda_0/4$ where $\lambda_0$ is the SAW wavelength at the signal frequency.

In an embodiment of the invention described below, the groups of electrodes are all similar to one another and have the same polarity sequence. Each group of electrodes comprises five electrodes with a polarity sequence ++−+−, or eight electrodes with a polarity sequence ++−+−−+−. The SAW device can advantageously comprise two of said transducers arranged for propagation of SAWs between them, said one direction, for constructive interference of SAWs at the signal frequency, for each transducer being towards the respective other transducer. In this case, for each transducer, the groups of electrodes can be all similar to one another with the same polarity sequence, and the two transducers can have different groups of electrodes and polarity sequences for the same signal frequency.

Another aspect of the invention provides a SAW (surface wave) device interdigital transducer comprising a plurality of groups each of q consecutive electrodes having a predetermined polarity sequence, each group having a length $r\lambda_0$ along the transducer, for transducing SAWs with a wavelength $\lambda_0$ at a frequency $f_0$, where q is a positive integer greater than 2 and r is a positive integer less than q and not equal to q/2, the groups being arranged along the length of the transducer to operate coherently for SAWs at the frequency $f_0$, the transducer further comprising at least one reflector for reflecting SAWs at the frequency $f_0$, the reflector being positioned relative to said groups to provide constructive interference of SAWs at the frequency $f_0$ in one direction along the length of the transducer and to provide destructive interference of SAWs at the frequency $f_0$ in an opposite direction, the reflector comprising one or more reflector electrodes, each reflector electrode and each space between reflector electrodes having a width of at least about $\lambda_0/4$.

Preferably the reflector is arranged between two of said groups of electrodes and has a length equal to an integer number of wavelengths $\lambda_0$; in particular the reflector may have a length of $r\lambda_0$ or an integer multiple thereof. In one embodiment described below, q=5 and r=3; in another embodiment, q=8 and r=5.

The invention also provides a SAW device comprising two transducers each as recited above on a substrate of piezoelectric material, the transducers being arranged for propagation between them of SAWs at the frequency $f_0$, each transducer having said one direction, for constructive interference of SAWs at the frequency $f_0$, towards the respective other transducer.

In one form of such a SAW device described below, for each transducer, all groups of electrodes are similar to one another and have the same polarity sequence. In this form of the SAW device, preferably the groups of electrodes and polarity sequences of one of the two transducers are different from the groups of electrodes and polarity sequences of the other of the two transducers. For example, for one of the transducers q=5 and r=3, and for the other of the transducers q=8 and r=5.

The invention further provides a SAW device comprising a spatial harmonic transducer having a preferential direction for propagation of SAWs at a spatial harmonic signal frequency of the transducer, the transducer comprising a plurality of groups of electrodes having a predetermined polarity sequence for transducing SAWs at said frequency, and at least one reflector for reflecting SAWs at said frequency, the reflector being positioned relative to said groups of electrodes to provide relative constructive interference of SAWs at said frequency in one direction along the length of the transducer and to provide relative destructive interference of SAWs at said frequency in an opposite direction, the reflector comprising one or more reflector electrodes, each reflector electrode and each space between reflector electrodes having a width of at least about one quarter of a SAW wavelength at said frequency.

BRIEF DESCRIPTION OF THE DRAWINGS

The invention will be further understood from the following description with reference to the accompanying drawings, in which schematically and by way of example.

DETAILED DESCRIPTION

Figure 1:
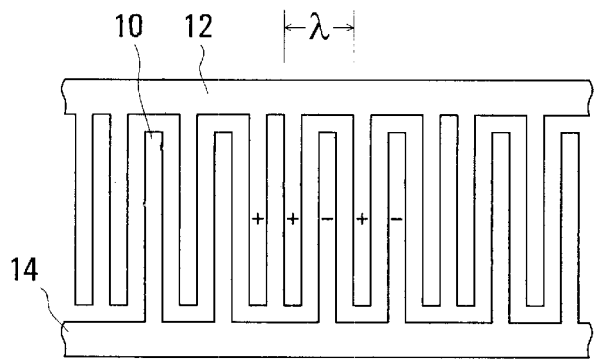
FIG. 1 illustrates an electrode pattern of a known spatial harmonic transducer for a SAW device.

Referring to the drawings, various figures including FIG. 1 illustrate patterns of a transducer for a SAW device, comprising interdigital fingers or electrodes 10 which extend from parallel conductive rails 12 and 14 on a surface of a substrate of piezoelectric material represented by the plane of the drawing. For example, a signal may be supplied to the rail 12 and the rail 14 may be grounded, or a differential signal may be applied between the rails 12 and 14. For simplicity and convenience in this description, electrodes connected to the rail 12 are referred to as active electrodes and are allocated a positive (+) signal polarity, and electrodes connected to the rail 14 are referred to as ground electrodes and are allocated a negative (−) signal polarity.

FIG. 1 shows a pattern of the electrodes 10 of a uniform spatial harmonic transducer referred to as an SE5 transducer, in which over the length of the transducer periodic groups each of five consecutive electrodes 10 are connected to the rails 12 and 14 to provide the repetitive polarity sequence ++−+−, as shown in FIG. 1 for a middle one of three groups each of five electrodes shown in FIG. 1. Each group of five consecutive electrodes with this polarity sequence is referred to as an SE unit or an SE5 unit. As shown in FIG. 1, the electrodes 10 have uniform width and spacing, in this case both equal to $\lambda/4$ although this need not necessarily be the case, where $\lambda$ is a wavelength determined by the structure of the transducer.

Figure 2:
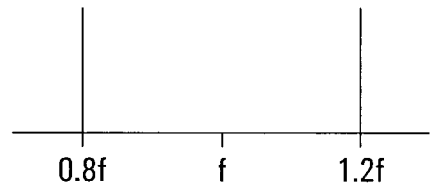
FIG. 2 represents an idealized frequency response for the transducer of FIG. 1.

FIG. 2 illustrates an idealized frequency response of an infinitely long transducer having the electrode pattern of FIG. 1, comprising an upper sideband at a frequency 1.2f and a lower sideband at a frequency 0.8f, where f is a frequency equal to the SAW velocity divided by the transducer structure wavelength $\lambda$.

Figure 3:
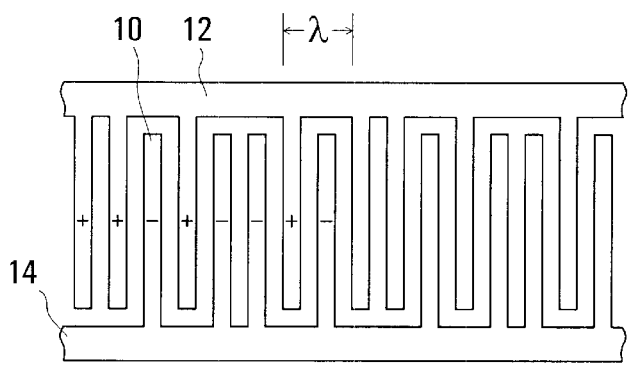
FIG. 3 illustrates an electrode pattern of another known spatial harmonic transducer for a SAW device.

Similarly, FIG. 3 shows a pattern of the electrodes 10 of a spatial harmonic transducer referred to as an SE8 transducer, in which over the length of the transducer periodic groups each of eight consecutive electrodes 10 are connected to the rails 12 and 14 to provide the repetitive polarity sequence ++−+−−+−, as shown in FIG. 3 for a left one of two groups each of eight electrodes shown in FIG. 3. In this case each group of eight consecutive electrodes with this polarity sequence is referred to as an SE unit or an SE8 unit. Again, as shown in FIG. 3, the electrodes 10 have uniform width and spacing $\lambda/4$, where $\lambda$ is the wavelength of the transducer structure.

Figure 4:
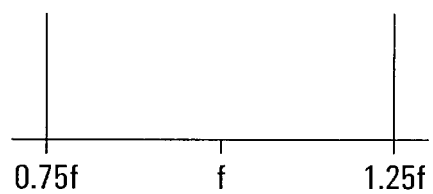
FIG. 4 represents an idealized frequency response for the transducer of FIG. 3.

FIG. 4 illustrates an idealized frequency response of an infinitely long transducer having the electrode pattern of FIG. 3, comprising an upper sideband at a frequency 1.25f and a lower sideband at a frequency 0.75f, where again f is a frequency equal to the SAW velocity divided by the transducer structure wavelength $\lambda$.

Other forms of spatial harmonic transducers are known or can be devised, and the SE5 and SE8 transducers described above are given by way of example. In order to provide a filter having only one passband, it is known to use harmonic transducers with different polarity sequences for the transmitting and receiving transducers of a SAW device, for example matching their upper sideband frequencies so that their lower sidebands are at different frequencies and accordingly are suppressed.

The spatial harmonic transducers discussed above are bidirectional transducers, i.e. a transduced SAW is propagated in or received from both directions along the length of the transducer, so that as explained above SAW devices using such transducers have high insertion losses which make them unsuitable for use as channel select filters and RF signal delay lines.

Figure 5:
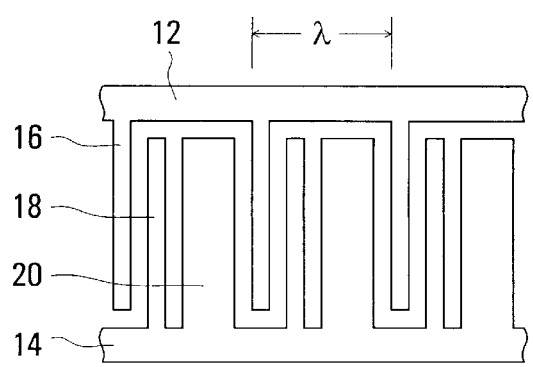
FIG. 5 illustrates an electrode pattern of a known SPUDT for a SAW device.

Conversely, a SAW device using SPUDTs (single phase unidirectional transducers) can provide a relatively low insertion loss. FIG. 5 illustrates a pattern of the electrodes of one known form of SPUDT, in this case having an IR-EWC (Improved Reflectivity Electrode Width Control) structure (also referred to as a DART or Distributed Acoustic Reflection Transducer). This structure has three electrodes per wavelength $\lambda$: an active electrode 16 connected to the rail 12, having a width of $\lambda/8$ and providing a transduction center; a grounded finger 18 connected to the rail 14 and also having a width of $\lambda/8$; and a reflector electrode 20 also connected to the rail 14, having a width of $3\lambda/8$ and providing a reflection center; the gaps between adjacent electrodes are all $\lambda/8$. The SPUDT is substantially unidirectional; transduced SAWs are propagated preferentially to the right with the structure shown in FIG. 5.

The SPUDT has electrode widths and spacings of typically $\lambda/8$, half that of the $\lambda/4$ widths and spacings of the spatial harmonic transducers described above. Consequently, the upper frequency limit (as determined by resolution limits of the photolithographic techniques used for manufacture) for SAW devices using SPUDTs is only about half that of spatial harmonic transducers, so that as stated above it has not been practical to manufacture SPUDT SAW devices for operation at frequencies of about 2 GHz.

Figure 6:
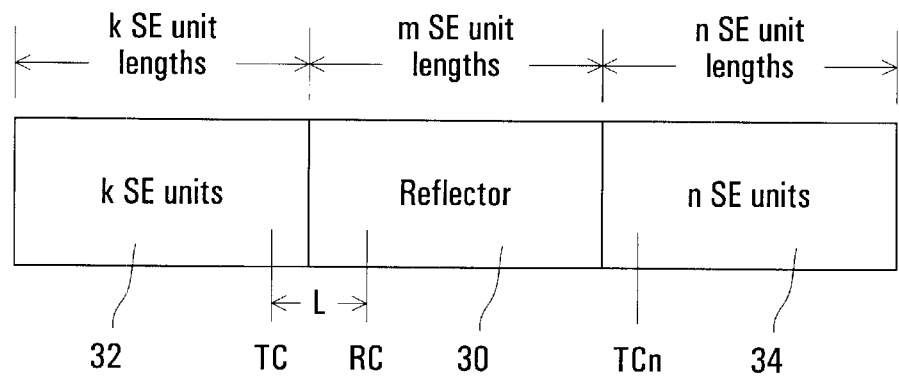
FIG. 6 is a diagram of a spatial harmonic transducer illustrating a principle of the invention.

FIG. 6 is a diagram of a spatial harmonic transducer illustrating a principle of the invention. As represented in FIG. 6, the transducer can be considered as comprising SE units as in a known spatial harmonic transducer for example as described above, at least one portion of which extending over a length of m SE units is replaced by a reflector 30. For example, as represented in FIG. 6 there is one reflector 30 of length m SE units, with k SE units 32 to its left and n SE units 34 to its right. Either k or n can be zero, i.e. the reflector 30 can be provided at the left or right end of a series of SE units, but preferably k and n are both positive integers. Although only one reflector 30 is shown in FIG. 6, the transducer may instead similarly comprise a plurality of reflectors 30, with further SE units between successive reflectors.

In a manner which is well known in relation to SPUDTs, a generation or transduction center can be determined for each SE unit, and a reflection center RC can be determined for the reflector 30, by synthesizing the responses of individual electrodes. The length of each SE unit is an integer number of wavelengths at the frequency of the signal transduced by the SE unit (signal frequency, e.g. the upper sideband frequency), so that adjacent SE units operate coherently and can all be regarded as having a single common transduction center. For the k SE units 32 in FIG. 6, this is represented as TC.

Similarly, the n SE units 34 in FIG. 6 can be regarded as having a single common transduction center represented as TCn. The value m is selected so that the separation of TCn from TC is an integer number of wavelengths at the signal frequency, so that the SE units 32 and 34 all operate coherently. Conveniently, m is a positive integer, but this need not be the case. For example, as described above the structure wavelength of an SE5 transducer is 1.2 times the wavelength for the upper sideband signal frequency of the transducer, so that the length of each SE5 unit of 5 electrodes is 5(1.2)/2=3 wavelengths of this signal frequency, and coherent operation of the SE units 32 and 34 can in this case be provided if m is an integer multiple of 1/3.

As shown in FIG. 6, the RC of the reflector 30 is spaced, in the length direction of the transducer, from the TC of the k SE units 32 by a distance L.

The reflector 30, examples of which are described below, is designed to reflect the signal frequency, whose wavelength is designated $\lambda_0$. For example, the reflector 30 can comprise a plurality of electrodes, which may be connected to the rail 12, or may be connected to the rail 14, or may be electrically floating, each with a width of $\lambda_0/4$ and with a spacing of $\lambda_0/4$ between adjacent electrodes.

The distance L is selected to provide the overall transducer with directionality, so that a SAW at the signal frequency is propagated preferentially to the right or left as may be desired, by providing constructive interference for generated and reflected waves in one direction and destructive interference for generated and reflected waves in the opposite direction along the length of the transducer.

To this end, the distance L is selected to be equal to $(\lambda_0/8)+(p\lambda_0/2)$ for maximum directionality to the right, and equal to $(3\lambda_0/8)+(p\lambda_0/2)$ for maximum directionality to the left, where in each case p is zero or a positive integer.

It can therefore be seen that the reflector 30 has the effect of converting a bidirectional spatial harmonic transducer into a single phase unidirectional spatial harmonic transducer, and that this can be done using electrode widths and spacings of at least $\lambda_0/4$, thereby avoiding the resolution limitations of conventional SPUDTs using electrode widths and spacings of $\lambda/8$. Thus for the same resolution, the transducer of FIG. 6 can have twice the signal frequency of a conventional SPUDT, and its insertion loss can be considerably reduced by selecting the distance L to make the transducer substantially unidirectional. This doubling of signal frequency can be further increased, for example to 2.4 times the signal frequency for the same resolution, by using wider electrodes in the reflector 30 as described further below.

Figure 7:
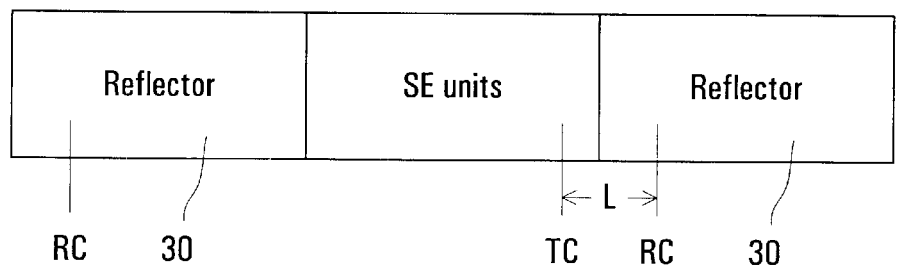
FIG. 7 is a diagram of another spatial harmonic transducer using a principle of the invention.

FIG. 7 illustrates in a similar manner to FIG. 6 another spatial harmonic transducer using a principle of the invention. As shown in FIG. 7, a respective reflector 30 is provided at each end of a plurality of SE units, with spacings (e.g. L) of their reflection centers RC from a transduction center TC of the SE units determined as described above for optimum directionality of the overall transducer.

It can be appreciated from FIGS. 6 and 7 that the transducer can be provided with one or more reflectors, provided at and/or between the ends of the transducer, to provide desired reflections at the signal frequency and hence desired unidirectional or preferential direction characteristics, and the reflectors may be similar to or different from one another as may be desired. Correspondingly, the transducer may comprise a single series of SE units as in FIG. 7, two series of such units 32 and 34 as in FIG. 6, or more than two series of such units in other transducer arrangements in accordance with the invention.

Figure 8:
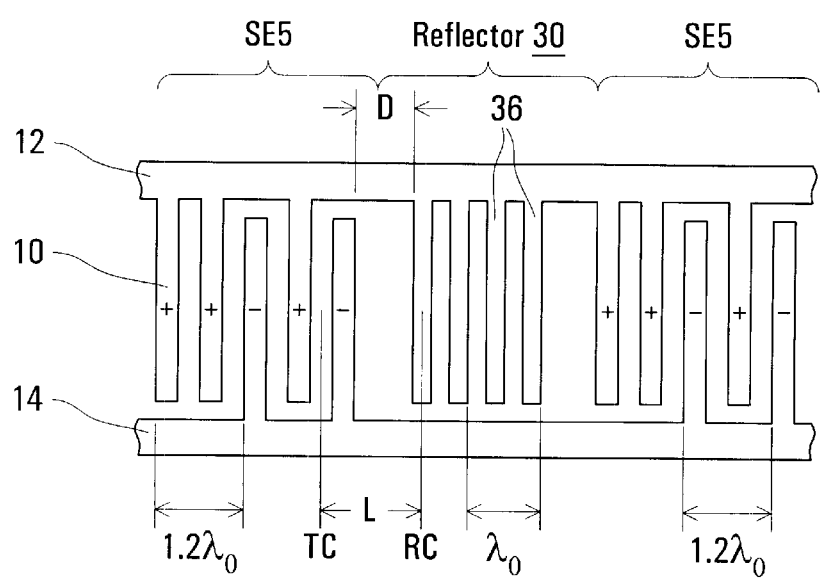
FIG. 8 illustrates in more detail parts of a transducer in accordance with an embodiment of the invention.

FIG. 8 illustrates in more detail parts of an SE5 spatial harmonic transducer in accordance with an embodiment of the invention, showing the reflector 30 of FIG. 6 having a length of one (m=1) SE5 unit, and one adjacent SE5 unit on each side of the reflector 30.

As illustrated in FIG. 8, each SE5 unit has five electrodes with the polarity sequence ++−+− as described above, with equal electrode widths and spacings (50% metallization ratio) each of $1.2\lambda_0/4$. As described above, such a structure excites a SAW with an upper sideband at a frequency 1.2 times that corresponding to the structure pitch, and hence at a frequency $f_0$ corresponding to the SAW wavelength $\lambda_0$. In this case the reflector 30 has the same length, $3\lambda_0$, as each SE5 unit, so that the SE5 units operate coherently for the excited SAW at the frequency $f_0$.

The reflector 30 in the transducer of FIG. 8 comprises four electrodes 36, in this case all connected to the rail 12, with in this case equal electrode widths and spacings of $\lambda_0/4$. Thus these electrodes act in known manner as a reflector for the excited SAW at the frequency $f_0$.

FIG. 8 also illustrates a transduction center TC for the SE5 units to the left of the reflector 30, and a reflection center RC for the reflector electrodes 36, separated by the distance L as described above. As illustrated in FIG. 8, this distance L is equal to $11\lambda_0/8$, so that the transducer has a maximum directionality to the left. In other words, with this transducer as illustrated there is maximum constructive interference at the frequency $f_0$ for the SAWs generated by the SE5 units propagated to the left with SAWs reflected to the left by the reflector 30, and maximum destructive interference at this frequency for SAWs propagated and reflected to the right. As explained above, the converse can be provided by changing the distance L by $\lambda_0/4$, so that directionality of the transducer can be controlled by adjustment of the distance L.

Viewed alternatively, it can be determined that in the transducer of FIG. 8 maximum directionality to the right is provided when a spacing or distance D between closest edges of adjacent electrodes 10 and 36 is equal to $(0.55+p/2)\lambda_0$, and maximum directionality to the left is provided when this distance D is equal to $(0.3+p/2)\lambda_0$, where in each case p is zero or a positive integer. As illustrated in FIG. 8, this distance D is equal to $(0.3+1/2)\lambda_0$.

Figure 9:
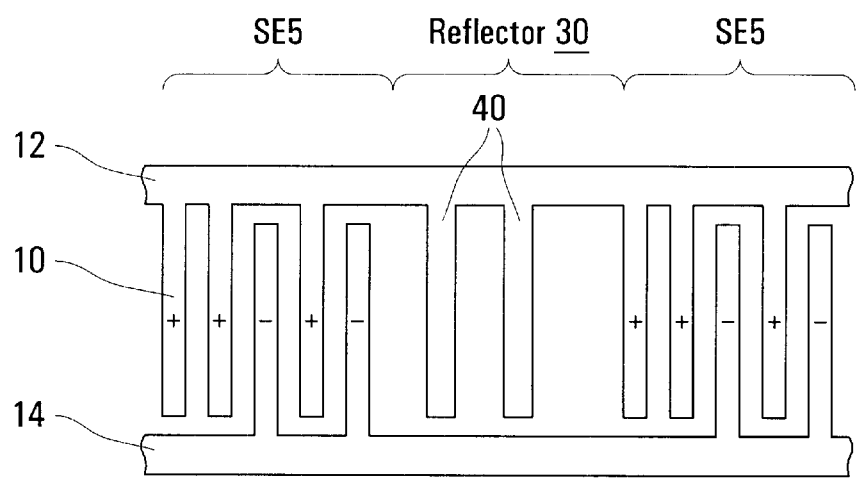
FIGS. 9 to 14 illustrate alternative forms of the transducer of FIG. 8.

FIG. 9 illustrates an alternative form of the transducer of FIG. 8, in which the reflector electrodes 36 are replaced by a smaller number of wider reflector electrodes 40. As illustrated in FIG. 9, the reflector 30 comprises two reflector electrodes 40 each having a width of $3\lambda_0/8$ with a spacing of $5\lambda_0/8$ between these electrodes 40. Other numbers, widths, and spacings of reflector electrodes may alternatively be used for reflecting SAWs in known manner. The use of such wider reflector electrodes can reduce by a factor of 1.2 (the ratio of the structure wavelength of the SE5 units to the wavelength of the excited SAW) the resolution required for manufacture of a SAW device using the transducer; consequently for the same resolution the frequency $f_0$ of the SAW device can be further increased.

Figure 10:
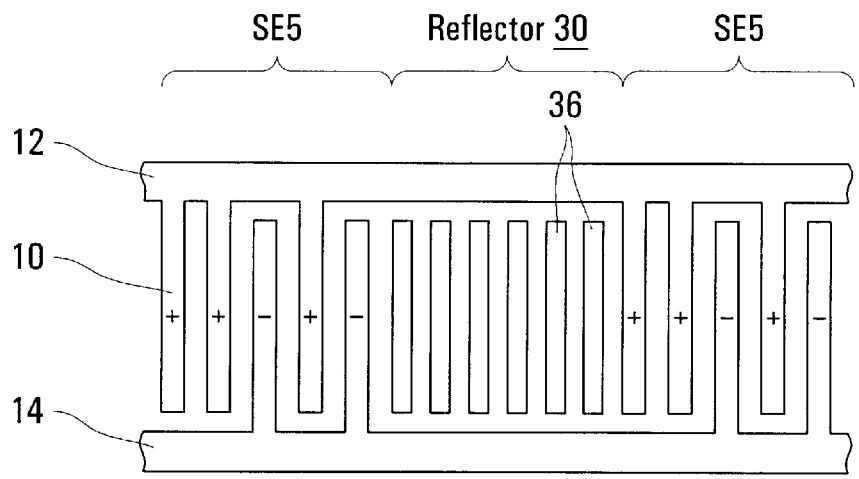

FIG. 10 illustrates another alternative form of the transducer of FIG. 8, in which the number of reflector electrodes 36 is increased, and instead of all being connected to the rail 12 the reflector electrodes 36 are all electrically floating.

Figure 11:
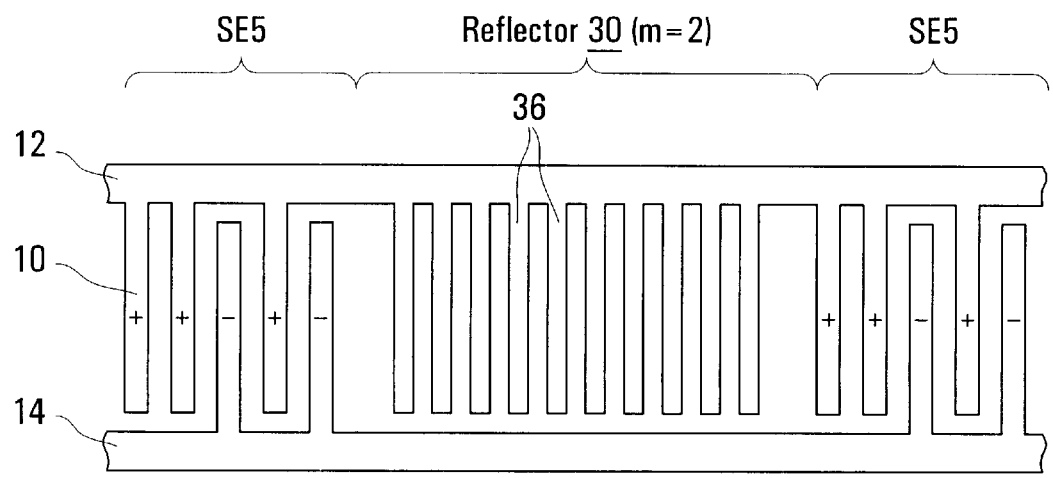

FIG. 11 illustrates a further alternative form of the transducer of FIG. 8, in which the reflector 30 extends over an increased distance of m=2 SE5 units. Consequently, the reflector 30 can have a greater number of reflector electrodes 36 as illustrated, and can provide a greater reflection coefficient. It can be appreciated that with increasing values of m the reflection coefficient increases and the generation of the excited SAW is reduced because, for a given length of the transducer, more SE5 units are replaced. Consequently, the value m and the number of reflector electrodes 36 can be selected to provide a desired balance between generation and reflection of the excited SAW frequency.

Figure 12:
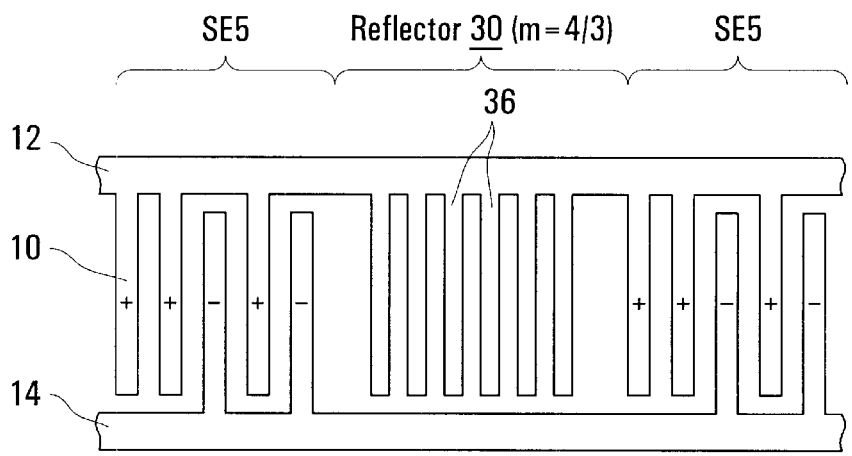
Figure 13:
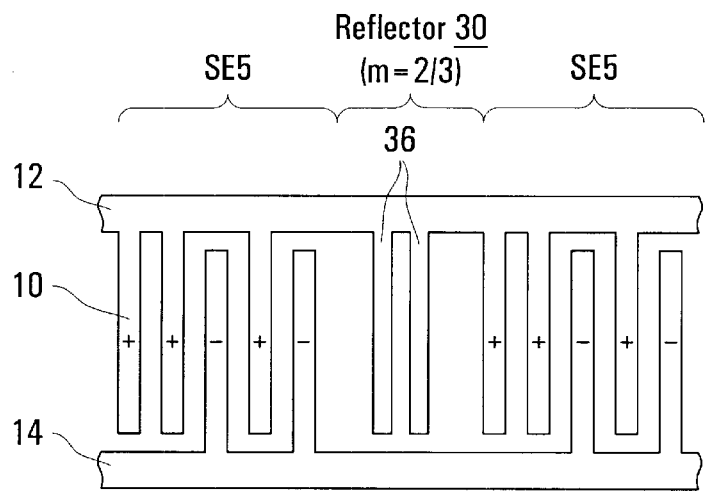

As indicated above, the value of m need not be an integer; a non-integer value of m can be chosen as long as it is appropriate for the different SE units to operate coherently. Thus in the case of an SE5 transducer, with each SE5 unit having a length equal to 3 wavelengths $\lambda_0$, m can be selected to be any integer multiple of 1/3. For example, FIGS. 12 and 13 illustrate alternative forms of the transducer of FIG. 8 in which m is selected to be 4/3 and 2/3 respectively, the number of reflector electrodes 36 being increased and decreased respectively. It can be appreciated that in each case the length of the reflector 30 is an integer number (4 and 2 respectively) of wavelengths $\lambda_0$, so that in each case the SE5 units throughout the transducer operate coherently for the excited SAW frequency $f_0$.

Figure 14:
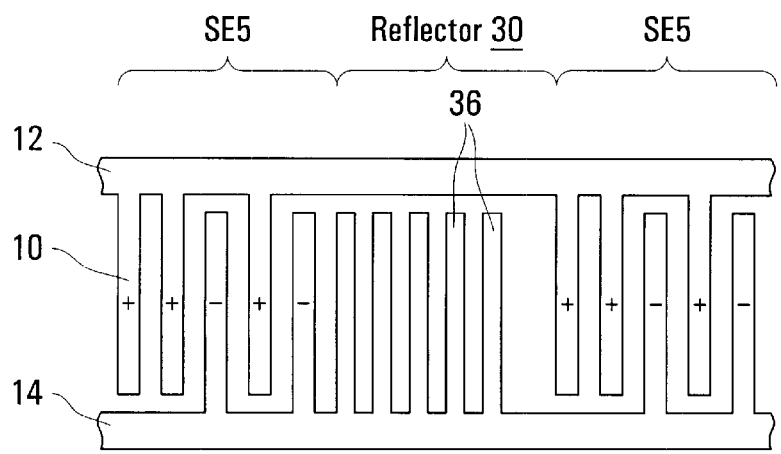

FIG. 14 illustrates another alternative form of the transducer of FIG. 8 in which the number of reflector electrodes 36 is increased, and these reflector electrodes are connected to the rail 14 rather than to the rail 12.

The various alternatives described above with reference to FIGS. 6 to 14 can be used in various combinations, and while they are described in relation to an SE5 transducer it should be appreciated that the same principles can be applied to other forms of harmonic transducer. For example in this respect, FIG. 15 illustrates, in a manner similar to FIG. 8, parts of one form of an SE8 spatial harmonic transducer in accordance with an embodiment of the invention.

Figure 15:
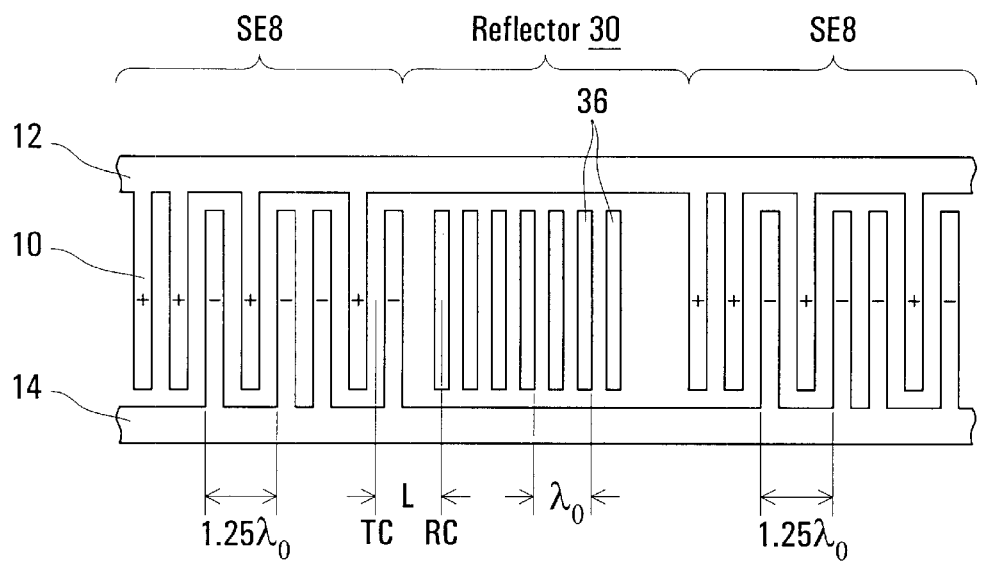
FIG. 15 illustrates in more detail parts of another transducer in accordance with an embodiment of the invention.

Similarly to FIG. 8, FIG. 15 illustrates the reflector 30 of FIG. 6 having a length of one (m=1) SE8 unit, and one adjacent SE8 unit on each side of the reflector 30. Each SE8 unit has eight electrodes with the polarity sequence ++−+−−+− as described above, with equal electrode widths and spacings (50% metallization ratio) each of $1.25\lambda_0/4$. As described above, such a structure excites a SAW with an upper sideband at a frequency 1.25 times that corresponding to the structure pitch, and hence again at the frequency $f_0$ corresponding to the SAW wavelength $\lambda_0$. In this case the reflector 30 has the same length, $5\lambda_0$, as each SE8 unit. For coherent operation of the SE8 units for the excited SAW at the frequency $f_0$, again the length of the reflector 30 can be any positive integer number of wavelengths $\lambda_0$.

The reflector 30 in the transducer of FIG. 15 comprises seven electrodes 36, in this case all electrically floating and with equal electrode widths and spacings of $\lambda_0/4$. Again, these electrodes 36 act in known manner as a reflector for the excited SAW at the frequency $f_0$.

FIG. 15 also illustrates a transduction center TC for the SE8 units to the left of the reflector 30, and a reflection center RC for the reflector electrodes 36, separated by the distance L as described above. As illustrated in FIG. 15, this distance L is equal to $9\lambda_0/8$, so that the transducer has a maximum directionality to the right. In other words, with this transducer as illustrated there is maximum constructive interference at the frequency $f_0$ for the SAWs generated by the SE8 units propagated to the right with SAWs reflected to the right by the reflector 30, and maximum destructive interference at this frequency for SAWs propagated and reflected to the left. As explained above, the converse can be provided by changing the distance L by $\lambda_0/4$, so that directionality of the transducer can again be controlled by adjustment of the distance L.

All of the alternatives described above with reference to FIGS. 9 to 14 in relation to the SE5 transducer of FIG. 5 can also be applied to the SE8 transducer of FIG. 15.

In the above description, it is assumed here that all of the SE units within the same transducer are similar, for example they are all SE5 or all SE8 transducer units. However, this need not necessarily be the case, and conceivably different types of SE unit could be used in different parts of the same transducer. For example, in a transducer having the form shown in FIG. 6 with one reflector 30 between two series of SE units 32 and 34, conceivably the SE units 32 could be SE5 units and the SE units 34 could be SE8 units with matched upper sideband frequencies (the signal frequency). In this case the length of the reflector 30 would again be such that the SE5 and SE8 units operate coherently for SAWs at this signal frequency.

Although the above description relates to the frequency $f_0$ of the upper sideband in each case, similar comments apply to a large extent to SAWs at the lower sideband frequency. For example, for an SE5 transducer, a reflector length of m=1 SE5 units is equal to three SAW wavelengths at the upper sideband frequency $f_0$ as described above, and is equal to two SAW wavelengths at the lower sideband frequency.

In order to provide a SAW device having only a single passband, it may be desirable to use two different spatial harmonic transducers as the transmitting and receiving transducers, matching the frequencies of the upper (preferably, for highest frequency operation) sidebands of the transducers so that the frequencies of the lower sidebands are different. Matching networks for coupling signals to and from the transducers can also be tuned to maximize the upper sidebands in preference to the lower sidebands. Conceivably also the lengths of the reflectors 30 of the transducers can be selected so that the transducers operate coherently for the upper sideband frequency and not for the lower sideband frequencies.

Figure 16:
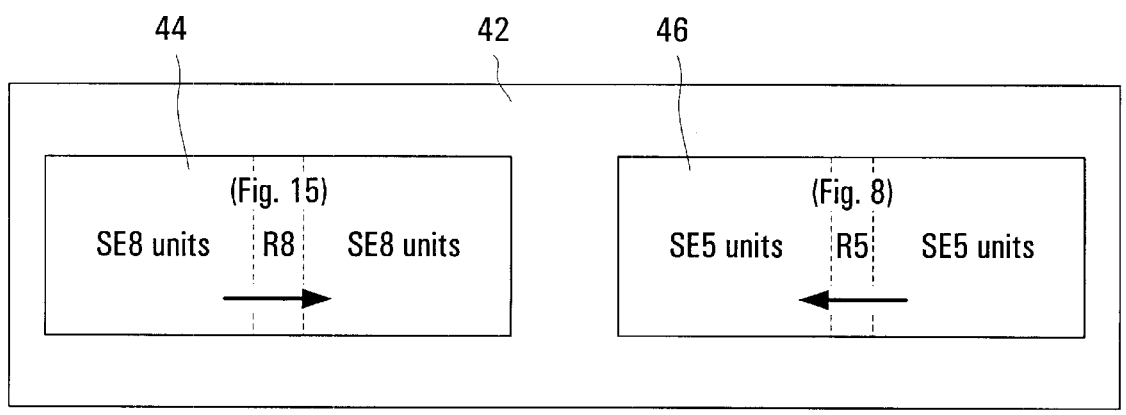
FIG. 16 illustrates one form of SAW device using transducers in accordance with embodiments of the invention.

The two different spatial harmonic transducers are aligned with one another, with their preferential directions towards one another, for propagation between them of excited SAWs at their matched upper sideband frequency $f_0$, for example as illustrated in FIG. 16 for a SAW device comprising one SE5 transducer and one SE8 transducer.

Referring to FIG. 16, the SAW device shown therein comprises a substrate 42 of piezoelectric material on which is provided an SE8 transducer 44, for example as described above with reference to FIG. 15, and an SE5 transducer 46, for example as described above with reference to FIG. 8, the upper sideband frequencies of both transducers being $f_0$ as described above. The SE8 transducer 44, at the left as illustrated in FIG. 16, comprises SE8 units and a reflector R8 to provide a preferential direction for SAW propagation to the right as illustrated by an arrow. Conversely, the SE5 transducer 46, at the right as illustrated in FIG. 16, comprises SE5 units and a reflector R5 to provide a preferential direction for SAW propagation to the left as illustrated by an arrow. Thus, a SAW at the frequency $f_0$ propagated to the right from the SE8 transducer is received by the SE5 transducer, and vice versa.

It can be appreciated that other combinations of spatial harmonic transducers may be used in the arrangement of FIG. 16, and that each transducer may have any of the forms described above.

It can be seen from the above description that the invention facilitates the provision of spatial harmonic transducers which are unidirectional, or have a preferred direction of propagation, thereby substantially reducing insertion loss of the transducers and of SAW devices using such transducers. Furthermore, this directionality of the transducers is achieved without using electrode widths less than a quarter of the SAW wavelength $\lambda_0$ at the signal frequency $f_0$, and optionally with electrode widths and spacings of at least $1.2\lambda_0/4$, so that the signal frequency $f_0$ can be two, or optionally 2.4, times that of a conventional SPUDT with the same photolithographic resolution limits.

Consequently, the invention facilitates the provision of low insertion loss SAW devices operable at frequencies of the order of 2 GHz, which can be particularly suited for use as channel select filters and as delay lines for operation at such a frequency. For use as a delay line, it can be appreciated that in a SAW device having the form illustrated in FIG. 16 the separation of the transducers 44 and 46 is selected to provide the desired delay.

Although as described above for convenience and clarity the reflector 30 is in each case shown between boundaries of adjacent SE units, for example in FIG. 15 the reflector 30 has a complete SE8 unit immediately to its left and another complete SE8 unit immediately to its right, this need not necessarily be the case. Instead, the or each reflector can be provided at any point along the length of the transducer, at or between boundaries of SE units, as long as coherent operation of the SE units along the length of the transducers is maintained, as described above, at the desired frequency $f_0$ of the excited SAWs.

In addition, although as described above the reflector pitch (electrode widths and spacings) is based on the SAW wavelength $\lambda_0$, this is not precisely necessary and instead the reflector pitch can be based on a slightly different wavelength, as long as the signal frequency $f_0$ corresponding to the SAW wavelength $\lambda_0$ is within a bandwidth of the reflector 30.

Thus although particular embodiments of the invention are described in detail above, it can be appreciated that these and numerous other modifications, variations, and adaptations may be made within the scope of the invention as defined in the claims.

What is claimed is:

1. A SAW (surface wave) device comprising an interdigital transducer on a substrate of piezoelectric material, the transducer comprising a plurality of repeated groups each of at least five electrodes, the electrodes of each group having a predetermined polarity sequence, the groups being arranged along a length of the transducer to operate coherently for SAWs at a signal frequency of the transducer, the signal frequency having a spatial harmonic relationship to, and not being the same as, a SAW frequency corresponding to a pitch of said electrodes, wherein the transducer further comprises at least one reflector for reflecting SAWs at the signal frequency, the reflector being positioned along the length of the transducer adjacent to said groups of electrodes to provide constructive interference of SAWs at the signal frequency in one direction along the length of the transducer and to provide destructive interference of SAWs at the signal frequency in an opposite direction.

2. A SAW device as claimed in claim 1 wherein the reflector comprises reflector electrodes having a pitch determined by a SAW wavelength at the signal frequency, and the electrodes of said groups have a pitch determined by a SAW wavelength at a lower frequency to which the signal frequency is spatially harmonically related.

3. A SAW device as claimed in claim 2, wherein each electrode has a width of at least about $\lambda_0/4$ where $\lambda_0$ is the SAW wavelength at the signal frequency.

4. A SAW device as claimed in claim 1 wherein the groups of electrodes are all similar to one another and have the same polarity sequence.

5. A SAW device as claimed in claim 4 wherein each group of electrodes comprises five electrodes with a polarity sequence ++−+−.

6. A SAW device as claimed in claim 4 wherein each group of electrodes comprises eight electrodes with a polarity sequence ++−+−−+−.

7. A SAW device as claimed in claim 1, comprising two of said transducers arranged for propagation of SAWs between them, said one direction, for constructive interference of SAWs at the signal frequency, for each transducer being towards the respective other transducer.

8. A SAW device as claimed in claim 7 wherein, for each transducer, the groups of electrodes are all similar to one another and have the same polarity sequence.

9. A SAW device as claimed in claim 8 wherein the two transducers have different groups of electrodes and polarity sequences for the same signal frequency.

10. A SAW device as claimed in claim 9 wherein one of the transducers has groups of five electrodes with a polarity sequence ++−+−, and the other of the transducers has groups of eight electrodes with a polarity sequence ++−+−−+−.

11. A SAW (surface wave) device interdigital transducer comprising a plurality of repeated groups each of q consecutive electrodes having a predetermined polarity sequence, each group having a length $r\lambda_0$ along the transducer, for transducing SAWs with a wavelength $\lambda_0$ at a frequency $f_0$, where q is a positive integer greater than 4 and r is a positive integer less than q and not equal to q/2, the groups being arranged along the length of the transducer to operate coherently for SAWs at the frequency $f_0$, the transducer further comprising at least one reflector for reflecting SAWs at the frequency $f_0$, the reflector being positioned along the length of the transducer adjacent to said groups to provide constructive interference of SAWs at the frequency $f_0$ in one direction along the length of the transducer and to provide destructive interference of SAWs at the frequency $f_0$ in an opposite direction, the reflector comprising one or more reflector electrodes, each reflector electrode and each space between reflector electrodes having a width of at least about $\lambda_0/4$.

12. A SAW device transducer as claimed in claim 11 wherein the reflector is arranged between two of said groups of electrodes and has a length equal to an integer number of wavelengths $\lambda_0$.

13. A SAW device transducer as claimed in claim 12 wherein the reflector has a length of $r\lambda_0$ or an integer multiple thereof.

14. A SAW device transducer as claimed in claim 11 wherein q=5 and r=3.

15. A SAW device transducer as claimed in claim 11 wherein q=8 and r=5.

16. A SAW device comprising two transducers each as claimed in claim 11 on a substrate of piezoelectric material, the transducers being arranged for propagation between them of SAWs at the frequency $f_0$, each transducer having said one direction, for constructive interference of SAWs at the frequency $f_0$, towards the respective other transducer.

17. A SAW device as claimed in claim 16 wherein, for each transducer, all groups of electrodes are similar to one another and have the same polarity sequence.

18. A SAW device as claimed in claim 17 wherein the groups of electrodes and polarity sequences of one of the two transducers are different from the groups of electrodes and polarity sequences of the other of the two transducers.

19. A SAW device as claimed in claim 18 wherein for one of the transducers q=5 and r=3, and for the other of the transducers q=8 and r=5.

20. A SAW device comprising a spatial harmonic transducer having a preferential direction for propagation of SAWs at a spatial harmonic signal frequency of the transducer, the transducer comprising a plurality of repeated groups each of at least five electrodes having a predetermined polarity sequence for transducing SAWs at said spatial harmonic signal frequency, said spatial harmonic signal frequency having a spatial harmonic relationship to, and not being the same as, a SAW frequency corresponding to a pitch of said electrodes, and at least one reflector for reflecting SAWs at said spatial harmonic signal frequency, the reflector being positioned along the length of the transducer adjacent to said groups of electrodes to provide relative constructive interference of SAWs at said spatial harmonic signal frequency in one direction along the length of the transducer and to provide relative destructive interference of SAWs at said spatial harmonic signal frequency in an opposite direction, the reflector comprising one or more reflector electrodes, each reflector electrode and each space between reflector electrodes having a width of at least about one quarter of a SAW wavelength at said spatial harmonic signal frequency.

* * * * *

UNITED STATES PATENT AND TRADEMARK OFFICE
CERTIFICATE OF CORRECTION

PATENT NO. : 6,534,896 B2
DATED : March 18, 2003
INVENTOR(S) : Chun-Yun Jian et al.

It is certified that error appears in the above-identified patent and that said Letters Patent is hereby corrected as shown below:

Title page,
Item [54], should read -- SPATIAL HARMONIC TRANSDUCERS FOR SURFACE WAVE DEVICES HAVING REFLECTORS --

Signed and Sealed this

Seventh Day of October, 2003

JAMES E. ROGAN
*Director of the United States Patent and Trademark Office*